(12) United States Patent
Itou

(10) Patent No.: US 11,589,457 B2
(45) Date of Patent: Feb. 21, 2023

(54) WIRING SUBSTRATE

(71) Applicant: KYOCERA Corporation, Kyoto (JP)

(72) Inventor: Seiichirou Itou, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 128 days.

(21) Appl. No.: 17/256,036

(22) PCT Filed: Jun. 28, 2019

(86) PCT No.: PCT/JP2019/025764
§ 371 (c)(1),
(2) Date: Dec. 24, 2020

(87) PCT Pub. No.: WO2020/004605
PCT Pub. Date: Jan. 2, 2020

(65) Prior Publication Data
US 2021/0127486 A1 Apr. 29, 2021

(30) Foreign Application Priority Data
Jun. 29, 2018 (JP) .............................. JP2018-124602

(51) Int. Cl.
*H05K 1/02* (2006.01)
*H05K 3/10* (2006.01)
*H05K 3/00* (2006.01)
*H05K 3/38* (2006.01)

(52) U.S. Cl.
CPC .......... *H05K 1/0284* (2013.01); *H05K 3/108* (2013.01); *H05K 3/0052* (2013.01); *H05K 3/381* (2013.01); *H05K 2201/09827* (2013.01); *H05K 2201/09863* (2013.01); *H05K 2201/09981* (2013.01); *H05K 2203/1527* (2013.01)

(58) Field of Classification Search
CPC ........ H05K 1/0284; H05K 1/11; H05K 1/111; H05K 1/117; H05K 1/18; H05K 1/181; H05K 2201/0364; H05K 2201/0382
See application file for complete search history.

(56) References Cited

FOREIGN PATENT DOCUMENTS

| JP | 06-268368 | A | * | 9/1994 | ............. F25D 23/02 |
|----|-----------|---|---|--------|-------------------------|
| JP | 06-268368 | A |   | 9/1994 |                         |
| JP | 2001-102722 | A |   | 4/2001 |                     |
| JP | 2003-282795 | A |   | 10/2003 |                    |
| JP | 2007053349 | A | * | 3/2007 | ......... H01L 21/4846 |
| JP | 2019-028304 | A |   | 2/2019 |                     |

OTHER PUBLICATIONS

JP 2007/053349 A Translation (Year: 2022).*
JP-06-268368-A (Translation) (Year: 2022).*

* cited by examiner

*Primary Examiner* — Hoa C Nguyen
*Assistant Examiner* — John B Freal
(74) *Attorney, Agent, or Firm* — Volpe Koenig

(57) ABSTRACT

A wiring substrate includes: an insulating substrate comprising a corner constituted by two adjacent surfaces; wiring located continuously across the corner; wherein on at least one of the two adjacent surfaces, a part of the wiring disposed at an edge located at the corner has a thickness larger than a part of the wiring disposed away from the edge.

10 Claims, 6 Drawing Sheets

WIRING SUBSTRATE

TECHNICAL FIELD

The present disclosure relates to a wiring substrate for a semiconductor element or the like to be mounted.

BACKGROUND

A wiring substrate (sub-mount) for a semiconductor element or the like to be mounted has been utilized and various manufacturing methods thereof have been proposed.

As such a wiring substrate for an element to be mounted, there is a wiring substrate in which wiring is formed so as to be continuous from a main surface on which an element is to be mounted to a side-end surface (JP 2001-102722 A, etc.).

SUMMARY

A wiring substrate for mounting an electronic element according to the disclosure includes: an insulating substrate including a corner constituted by two adjacent surfaces; wiring located continuously across the corner; wherein on at least one of the two adjacent surfaces, a part of the wiring disposed at an edge located at the corner has a thickness larger than a part of the wiring disposed away from the edge.

DETAILED DESCRIPTION

Hereinafter, an embodiment of the present disclosure will be described with reference to the drawings.

Figure 1:
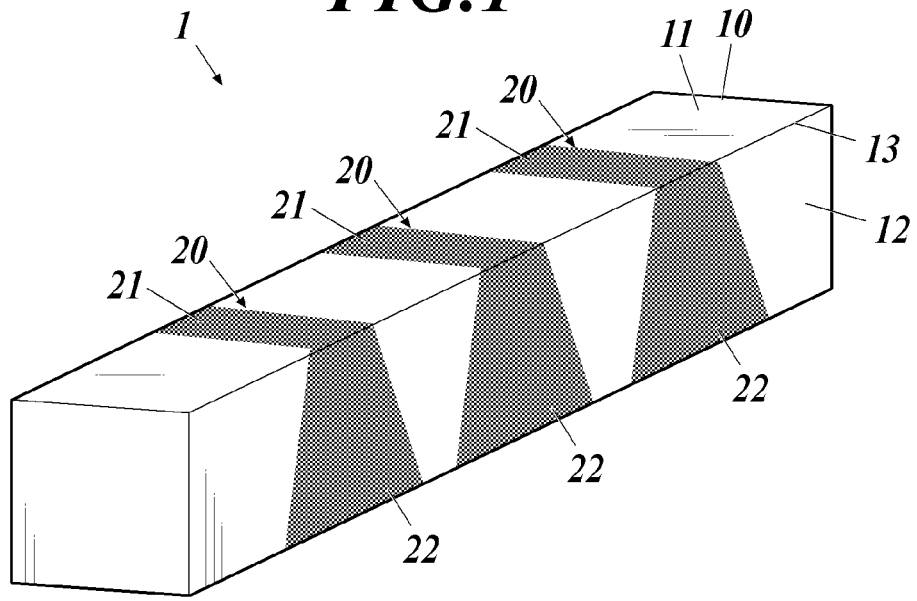
FIG. 1 is a perspective view schematically showing a wiring substrate according to an embodiment of the present disclosure.

FIG. 1 shows a wiring substrate 1 according to an embodiment of the present disclosure. As shown in FIG. 1, the wiring substrate 1 is configured such that wiring 20 made of a conductive material is located on an insulating substrate 10. A main surface 11 and a side-end surface 12 of the insulating substrate 10 are two surfaces adjacent to one another. The insulating substrate 10 has a corner 13 constituted by the main surface 11 and the side-end surface 12, which are two surfaces adjacent to one another.

The wiring 20 includes wiring 21 on the main surface 11 and wiring 22 on the side-end surface 12, and is continuous across the corner 13. The wiring substrate 1 is for an electronic element to be mounted. On the main surface 11, a pattern having a predetermined shape for element connection is formed by the wiring 21, so that an element mounting portion is provided. FIG. 1 shows the pattern that is simplified. The wiring 22 on the side-end surface 12 is utilized as a wiring connecting portion, such as a wire bonding region.

Figure 2:
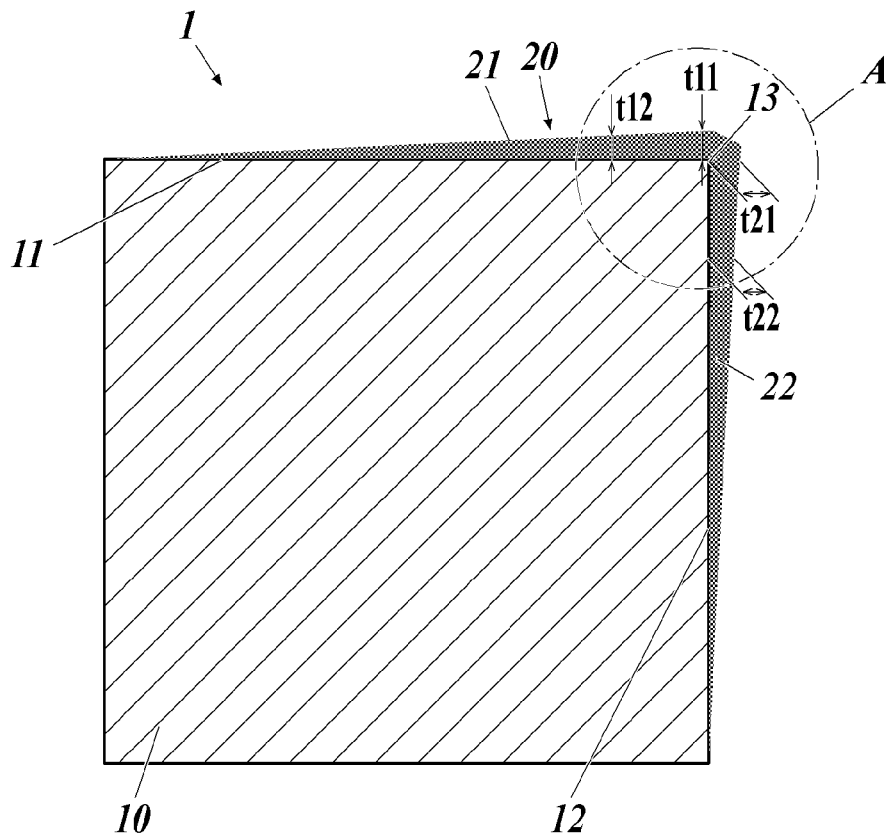
FIG. 2 is a cross-sectional view schematically showing the wiring substrate according to the embodiment of the present disclosure.
Figure 3:
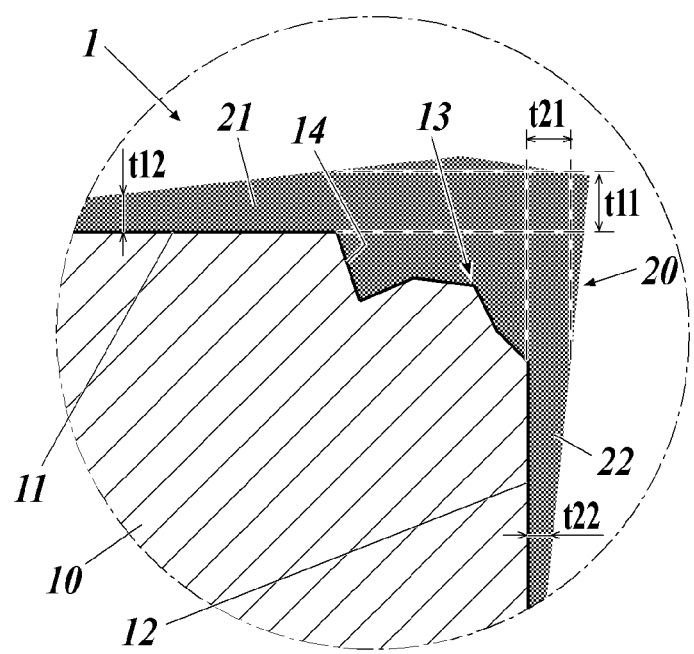
FIG. 3 schematically shows details of an A portion in FIG. 2.

As shown in FIG. 2 and FIG. 3, $t11$ represents the thickness of a part of the wiring 21 disposed at an edge located at the corner 13, and $t12$ represents the thickness of a part of the wiring disposed away from the edge toward the inside of the main surface 11. Similarly, as shown in FIG. 2 and FIG. 3, $t21$ represents the thickness of a part of the wiring 22 disposed at the edge located at the corner 13, and $t22$ represents the thickness of a part of the wiring 22 disposed away from the edge toward the inside of the side-end surface 12.

An expression of $t11>t12$ holds, and hence the thickness $t11$ is larger than the thickness $t12$.

The thickness of the wiring 21 has a gradual increase from the part of the wiring 21 disposed away from the edge toward the part of the wiring 21 disposed at the edge.

The thickness $t11$ of the part at the edge located at the corner 13 being larger than the thickness $t12$ of the more inward part makes the connection cross-sectional area of a part of the wiring 20 across the corner 13 large, and hence improves connection reliability of the part.

Although the thickness $t11$ and the thickness $t12$ are different from one another, the gradual increase of the thickness of the wiring 21 toward the corner 13 does not generate a sudden change portion of the wiring cross-sectional area, and hence can improve the connection reliability.

The effect of improving the connection reliability of the wiring 20 at the corner 13 can be obtained even if the wiring thickness is changed as described above on the main surface 11 only. This effect can be obtained even if the wiring thickness is changed as described above on the side-end surface 12. This is because in either case, the connection cross-sectional area of the part of the wiring 20 across the corner 13 becomes large. In this embodiment, in order to further enhance the effect, on each of the two surfaces 11, 12, which include the side-end surface 12, the wiring thickness is changed in the above-described manner.

That is, an expression of $t21>t22$ holds, and hence the thickness $t21$ is larger than the thickness $t22$.

The thickness of the wiring 22 has a gradual increase from the part of the wiring 22 disposed away from the edge toward the part of the wiring 22 disposed at the edge.

A relationship between the wiring 21 on the main surface 11 and the wiring 22 on the side-end surface 12 is as follows.

The wiring 21 on the main surface 11 is formed larger than the wiring 22 on the side-end surface 12. This applies to the whole, and hence the thickness of the wiring 21 is larger than the thickness of the wiring 22 without exception if parts having the same distance from the corner 13 are compared.

Further, as to the gradient of the gradual increase of the thickness of each of the wiring 21 and the wiring 22 toward the corner 13, the wiring 21 on the main surface 11 has a gentler gradient than the wiring 22 on the side-end surface 12.

This ensures the thickness of the wiring 21 on the main surface 11 that is made to have a wider area than the side-end surface 12, and hence can improve the connection reliability of the wiring 20.

Further, the thickness of the wiring 21 on which an electronic element is to be mounted being large prevents metallic diffusion at the time of bonding of the electronic element.

Further, the gradient of the wiring 21 on which an electronic element is to be mounted being gentle produces an effect of making the electronic element mounting portion level.

As shown in FIG. 3, the insulating substrate 10 has a concave chipped portion 14 located at the corner 13. As shown in FIG. 3, the wiring 20 is located at the chipped portion 14 too. The anchoring effect due to the wiring 20 located at the chipped portion 14 raises the degree of adhesion and the bonding strength of the wiring 20 to the insulating substrate 10 at the corner 13, and hence can prevent the wiring 20 from separating from the insulating substrate 10. This results in improving the connection reliability of the part of the wiring 20 across the corner 13.

Figure 4:
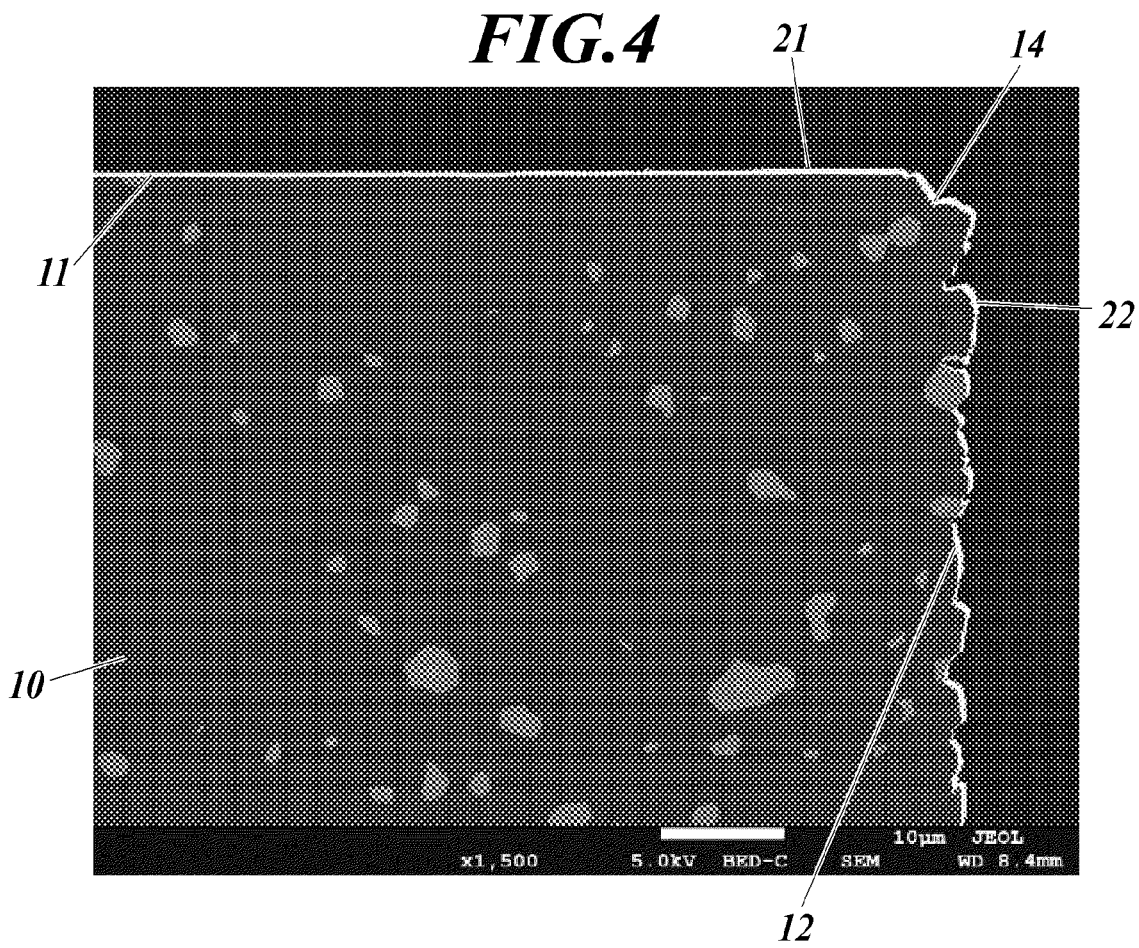
FIG. 4 is an image of a cross section of a prototype.

FIG. 4 shows an image of a cross section of a prototype.

As shown in FIG. 4, the side-end surface 12 has surface roughness rougher than the main surface 11 to raise the bonding strength of the wiring 22, which is thinner than the wiring 21 on the main surface 11, to the side-end surface 12. On the other hand, the main surface 11 is located on a smooth surface having surface roughness finer than the side-end surface 12 and having high precision to raise element mounting performance.

Next, a manufacturing method for obtaining the wiring substrate 1 having the above-described structure will be described.

Figure 5A:
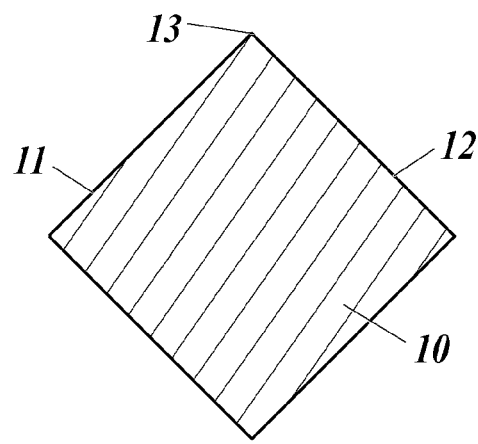
FIG. 5A is a step diagram for explaining an example of a method for manufacturing the wiring substrate according to the embodiment of the present disclosure.

First, a matrix substrate containing a plurality of insulating substrates 10 used for wiring substrates 1 is processed. The main surface of the matrix substrate corresponding to surfaces that serve as the main surfaces 11 of the insulating substrates 10 is polished, and then the matrix substrate is diced, and one insulating substrate 10 as shown in FIG. 5A is obtained. The main surface 11 of the insulating substrate 10 is the polished surface of the matrix substrate, and the side-end surface 12 of the insulating substrate 10 is the surface that has appeared by the matrix substrate being diced. Thus, the main surface 11 having high surface precision as described above and the side-end surface 12 being rough are obtained. In addition, due to chipping at the time of the dicing, the above-described chipped portion 14 is obtained.

Figure 5B:
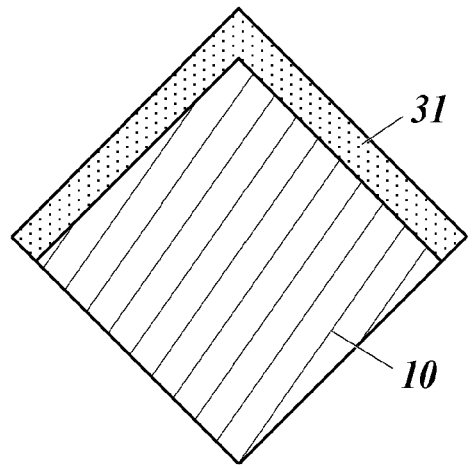
FIG. 5B is a step diagram following FIG. 5A.

Next, as shown in FIG. 5B, a Cu thin film 31 is formed on the main surface 11 and the side-end surface 12 of the insulating substrate 10 as a foundation layer.

Figure 5C:
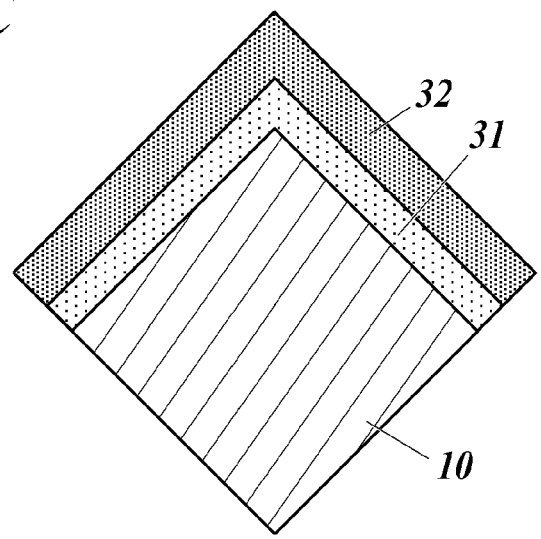
FIG. 5C is a step diagram following FIG. 5B.

Next, as shown in FIG. 5C, a resist film 32 is formed on the Cu thin film 31.

Figure 6A:
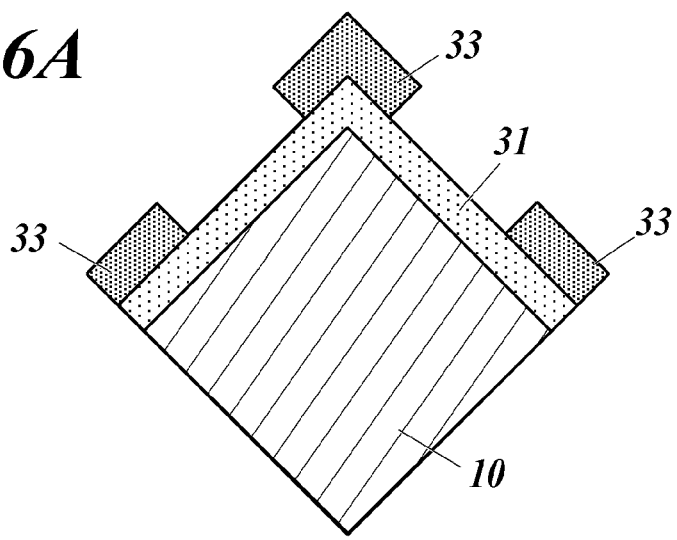
FIG. 6A is a step diagram following FIG. 5C.
Figure 8:
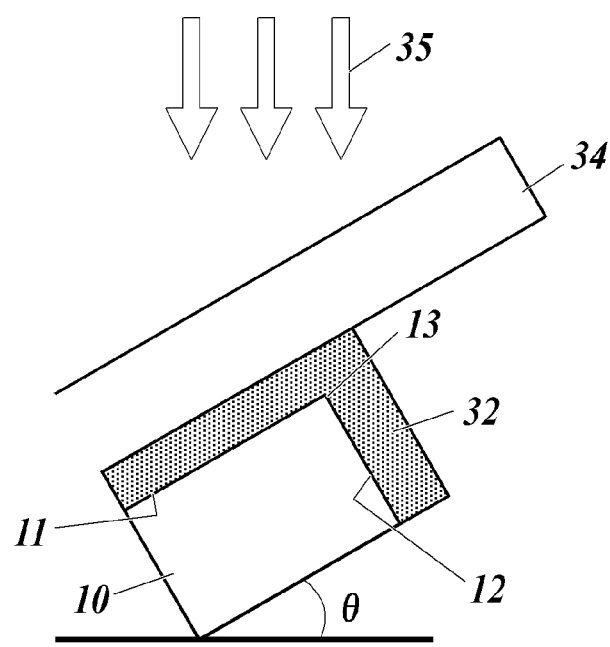
FIG. 8 is a schematic view for explaining an inclined exposure method.

Next, the resist film 32 is exposed and developed to form a resist mask 33 as shown in FIG. 6A. For the exposure, an inclined exposure method as shown in FIG. 8 is used. As shown in FIG. 8, a photomask 34, the main surface 11 and the side-end surface 12 are each disposed at an angle inclined with respect to parallel light 35 for exposure. As to the angle, as shown in FIG. 8, if an angle of the main surface 11 with respect to a plane perpendicular to the parallel light 35 for exposure is θ, it is appropriate that θ is 20 to 30 degrees. Thus, as compared with the side-end surface 12, the main surface 11 is disposed so as to be hit by the parallel light 35 for exposure more vertically. The photomask 34 is made to face the main surface 11. Consequently, the side-end surface 12 is disposed substantially at right angles to the photomask 34. Hence, the further a point on the side-end surface 12 is from the corner 13, the further the point is from the photomask 34. There is no such a relationship on the main surface 11.

Application of this exposure method results in producing the wiring 20 being relatively large on the main surface 11 and having a thickness that gradually increases, on each of the main surface 11 and the side-end surface 12, toward the corner 13. Because the further a point on the side-end surface 12 is from the corner 13, the further the point is from the photomask 34, the wiring 22 on the side-end surface 12 is formed, as shown in FIG. 1, so as to be wider as it is far from the corner 13.

Figure 6B:
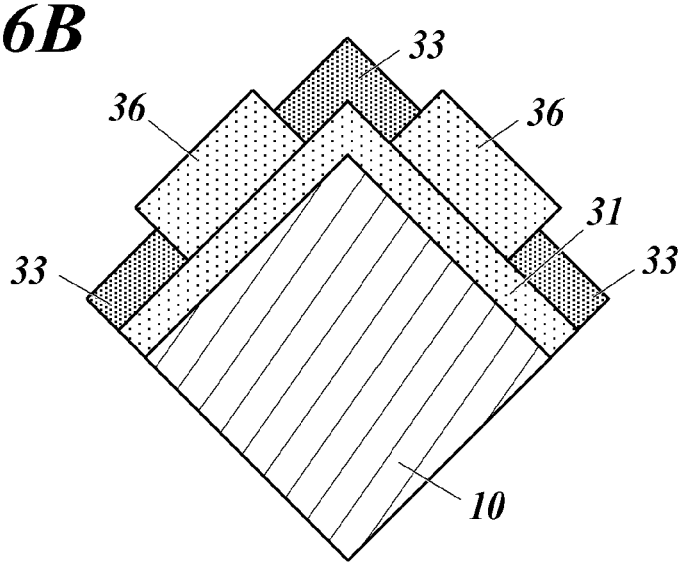
FIG. 6B is a step diagram following FIG. 6A.

Next, as shown in FIG. 6B, Cu plating is performed by using the resist mask 33 as a mask to form a Cu layer 36 on the Cu thin film 31 exposed from the resist mask 33.

Figure 6C:
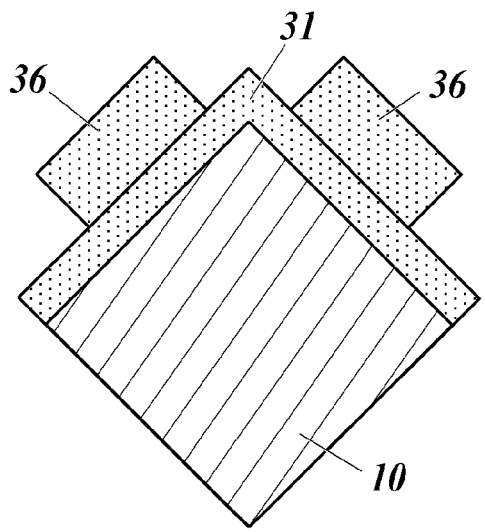
FIG. 6C is a step diagram following FIG. 6B.

Next, as shown in FIG. 6C, the resist mask 33 is removed.

Figure 7A:
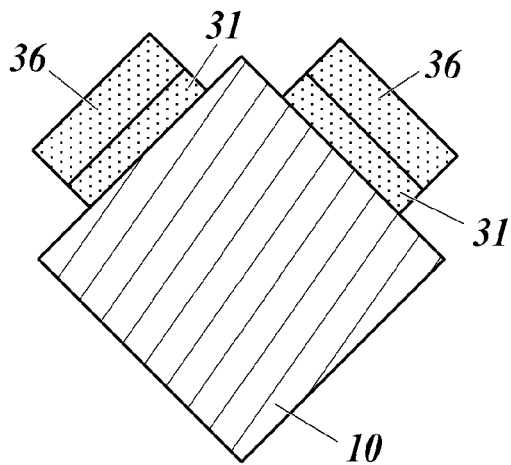
FIG. 7A is a step diagram following FIG. 6C.

Next, as shown in FIG. 7A, etching is performed to expose the insulating substrate 10 except a portion corresponding to the Cu layer 36.

Figure 7B:
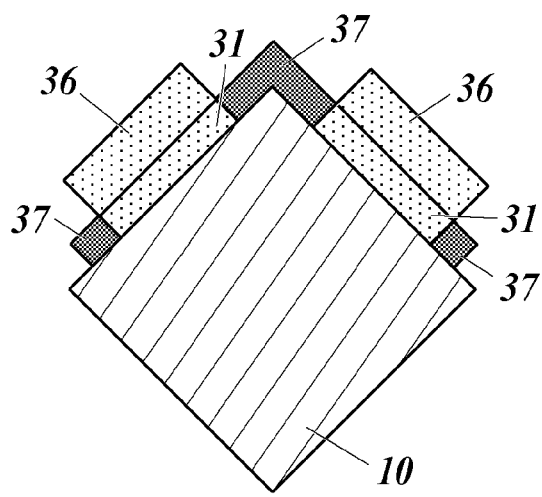
FIG. 7B is a step diagram following FIG. 7A.

Next, as shown in FIG. 7B, a precious metal film 37 that serves as a wiring material is formed by using the Cu layer 36 as a mold.

Figure 7C:
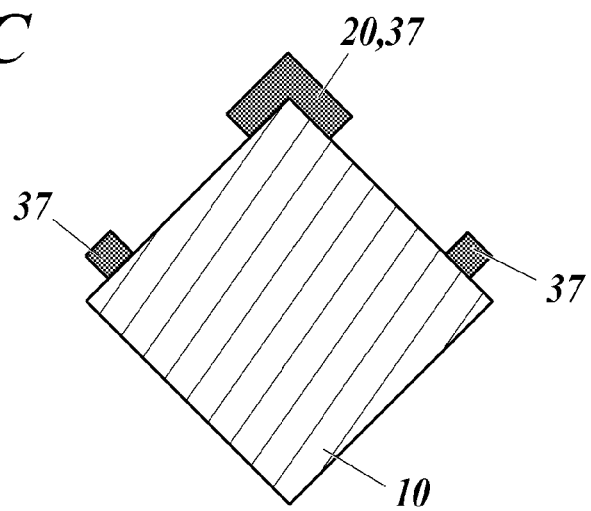
FIG. 7C is a step diagram following FIG. 7B.

Next, as shown in FIG. 7C, the Cu layer 36 is removed to expose the insulating substrate 10, so that a desired wiring pattern (37) including the wiring 20 across the corner 13 is obtained. The wiring 20 and the wiring pattern (37) are each, for example, a multilayer film in which, from the insulating substrate 10 side, a Ti film and a Pt film, a Ti film, a Pt film and an Au film, a Ti film and a Pd film, or a Ti film, a Pd film and an Au film are disposed, for example.

As described above, according to the wiring substrate 1 of this embodiment, the connection reliability of, of the wiring 20 continuous across the corner 13 of the substrate, the part across the corner 13 can be improved.

The above-described manufacturing method is merely an example of the method for obtaining the wiring substrate of the present disclosure. Needless to say, any manufacturing method is used to obtain the wiring substrate of the present disclosure.

INDUSTRIAL APPLICABILITY

The disclosure is applicable to a wiring substrate.

The invention claimed is:

1. A wiring substrate for mounting an electronic element, comprising:
    an insulating substrate comprising a corner constituted by two adjacent surfaces; and
    wiring located continuously across the corner, and wherein
    on at least one of the two adjacent surfaces, a part of the wiring disposed at an edge located at the corner has a thickness larger than a part of the wiring disposed away from the edge,
    one of the two adjacent surfaces is a main surface having an element mounting portion, and another of the two adjacent surfaces is a side-end surface,
    the thickness of the wiring on the main surface has a gradual increase from the part of the wiring disposed away from the edge toward the part of the wiring disposed at the edge,
    the thickness of the wiring on the side-end surface has a gradual increase from the part of the wiring disposed away from the edge toward the part of the wiring disposed at the edge, and a gradient of the gradual increase of the thickness of the wiring on the main surface is less than a gradient of the gradual increase of the thickness of the wiring on the side-end surface.

2. The wiring substrate according to claim 1, wherein the thickness of the wiring has a gradual increase from the part of the wiring disposed away from the edge toward the part of the wiring disposed at the edge.

3. The wiring substrate according to claim 1, wherein on each of the two adjacent surfaces, the part of the wiring disposed at the edge located at the corner has the thickness larger than the part of the wiring disposed away from the edge.

4. The wiring substrate according to claim 1, wherein the wiring on the main surface has the thickness larger than the wiring on the side-end surface.

5. The wiring substrate according to claim 1, wherein the insulating substrate has a concave chipped portion located at the corner, and the wiring is located at the chipped portion.

6. A wiring substrate for mounting an electronic element, comprising:
   an insulating substrate comprising a corner constituted by two adjacent surfaces;
   wiring located continuously across the corner, wherein on at least one of the two adjacent surfaces, a part of the wiring disposed at an edge located at the corner has a thickness larger than a part of the wiring disposed away from the edge,
   one of the two adjacent surfaces is a main surface having an element mounting portion, and another of the two adjacent surfaces is a side-end surface, and
   the wiring on the main surface has the thickness larger than the wiring on the side-end surface.

7. The wiring substrate according to claim 6, wherein the thickness of the wiring has a gradual increase from the part of the wiring disposed away from the edge toward the part of the wiring disposed at the edge.

8. The wiring substrate according to claim 6, wherein on each of the two adjacent surfaces, the part of the wiring disposed at the edge located at the corner has the thickness larger than the part of the wiring disposed away from the edge.

9. The wiring substrate according to claim 6, wherein
the thickness of the wiring on the main surface has a gradual increase from the part of the wiring disposed away from the edge toward the part of the wiring disposed at the edge, and
the thickness of the wiring on the side-end surface has a gradual increase from the part of the wiring disposed away from the edge toward the part of the wiring disposed at the edge.

10. The wiring substrate according to claim 6, wherein the insulating substrate has a concave chipped portion located at the corner, and the wiring is located at the chipped portion.

\* \* \* \* \*